US010423031B2

(12) United States Patent
Yamamoto et al.

(10) Patent No.: US 10,423,031 B2
(45) Date of Patent: Sep. 24, 2019

(54) LIGHT SOURCE DEVICE AND DISPLAY UNIT

(71) Applicant: SONY CORPORATION, Tokyo (JP)

(72) Inventors: Koichi Yamamoto, Kanagawa (JP); Kenji Kobayashi, Kanagawa (JP); Yasuhiro Nishida, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/333,007

(22) Filed: Jul. 16, 2014

(65) Prior Publication Data
US 2015/0036317 A1 Feb. 5, 2015

(30) Foreign Application Priority Data

Jul. 31, 2013 (JP) .................................. 2013-159328

(51) Int. Cl.
*G02F 1/1335* (2006.01)
*F21V 13/02* (2006.01)
*F21V 13/14* (2006.01)
*F21V 9/08* (2018.01)
*F21V 9/30* (2018.01)

(52) U.S. Cl.
CPC .......... *G02F 1/133609* (2013.01); *F21V 9/08* (2013.01); *F21V 9/30* (2018.02); *F21V 13/02* (2013.01); *F21V 13/14* (2013.01); *G02F 1/133603* (2013.01); *G02F 1/133605* (2013.01); *G02F 1/133606* (2013.01); *G02F 2001/133614* (2013.01); *H01L 2224/48091* (2013.01); *H01L 2224/49107* (2013.01); *H01L 2224/73265* (2013.01); *H01L 2924/181* (2013.01)

(58) Field of Classification Search
CPC . F21V 13/02; F21V 13/14; F21V 9/08; F21V 9/30; G02F 1/133603; G02F 1/133606; G02F 2001/133614; G02F 1/133609
See application file for complete search history.

(56) References Cited

U.S. PATENT DOCUMENTS

2005/0195341 A1* 9/2005 Koganezawa .... G02F 1/133603
349/62
2006/0017863 A1* 1/2006 Kim ..................... G02B 6/0021
349/62
2006/0092666 A1* 5/2006 Jeong ................. G02F 1/133603
362/613
2006/0146570 A1* 7/2006 Park .................. G02F 1/133603
362/613

(Continued)

FOREIGN PATENT DOCUMENTS

JP 2009-140829 A 6/2009

OTHER PUBLICATIONS

Non-Final Office Action cited in U.S. Appl. No. 16/449,705, dated Aug. 5, 2019.

Primary Examiner — Sean P Gramling
(74) Attorney, Agent, or Firm — Chip Law Group

(57) ABSTRACT

A light source device includes: a substrate; a plurality of light sources disposed on the substrate; a wavelength conversion member disposed to face the plurality of light sources; and a diffusion member disposed between the wavelength conversion member and the plurality of light sources, and configured to uniformize distribution of traveling direction angle of incident light.

19 Claims, 15 Drawing Sheets

(56) References Cited

U.S. PATENT DOCUMENTS

| | | | |
|---|---|---|---|
| 2007/0097708 A1* | 5/2007 | Shim | G02B 5/045 |
| | | | 362/620 |
| 2007/0109765 A1* | 5/2007 | Chang | G02F 1/133608 |
| | | | 362/97.2 |
| 2009/0135331 A1* | 5/2009 | Kawase | G02F 1/133605 |
| | | | 349/58 |
| 2009/0190330 A1* | 7/2009 | Kim | G02F 1/133603 |
| | | | 362/97.2 |
| 2009/0231835 A1* | 9/2009 | Roberts | G02F 1/133608 |
| | | | 362/97.3 |
| 2010/0238648 A1 | 9/2010 | Tsukahara | |
| 2011/0044027 A1* | 2/2011 | Chen | G02F 1/133603 |
| | | | 362/97.1 |
| 2011/0175518 A1 | 7/2011 | Reed et al. | |
| 2011/0304792 A1* | 12/2011 | Lee | G02F 1/133608 |
| | | | 349/58 |
| 2012/0243077 A1* | 9/2012 | Osawa | G02B 3/0056 |
| | | | 359/356 |
| 2013/0070165 A1* | 3/2013 | Shimizu | G02B 6/0091 |
| | | | 348/739 |
| 2014/0029239 A1* | 1/2014 | Oh | G02B 5/0242 |
| | | | 362/84 |
| 2014/0036533 A1* | 2/2014 | Smith-Gillespie | G02F 1/133615 |
| | | | 362/609 |
| 2015/0124433 A1* | 5/2015 | Onishi | H01S 5/0078 |
| | | | 362/84 |

* cited by examiner

LIGHT SOURCE DEVICE AND DISPLAY UNIT

CROSS REFERENCE TO RELATED APPLICATIONS

This application claims the benefit of Japanese Priority Patent Application JP 2013-159328 filed Jul. 31, 2013, the entire contents of which are incorporated herein by reference.

BACKGROUND

The present disclosure relates to a light source device suitable for a planar light source and to a display unit performing image display with use of illumination light from the light source device.

Backlight system used in a liquid crystal display unit and the like includes a direct system and an edge light system. As these backlights, in recent years, a light emitting diode (LED) is often used for a light source. When the LED is used as the light source, for example, there is a method in which surroundings of a blue LED is sealed by a resin containing a fluorescent substance to mix blue light and light emitted from the fluorescent substance, and thus white light is obtained. As another method, there is a method in which a fluorescent substance layer is disposed separately from the light source to obtain white light (Japanese Unexamined Patent Application Publication No. 2009-140829).

SUMMARY

The backlight as described above desirably has high uniformity as a planar light source. For example, uniform white light less in color unevenness and luminance unevenness may be desired. In the Japanese Unexamined Patent Application Publication No. 2009-140829, although there is proposed that a light control section that allows light from a light emitting element to enter a light emission surface of the fluorescent substance layer from a vertical direction or a substantially vertical direction is included and viewing angle dependency of chromaticity distribution of the fluorescent substance layer is suppressed, illumination light with higher quality is desired.

It is desirable to provide a light source device and a display unit that are capable of improving quality of illumination light.

According to an embodiment of the technology, there is provided a light source device including: a substrate; a plurality of light sources disposed on the substrate; a wavelength conversion member disposed to face the plurality of light sources; and a diffusion member disposed between the wavelength conversion member and the plurality of light sources, and configured to uniformize distribution of traveling direction angle of incident light.

According to an embodiment of the technology, there is provided a display unit provided with a light source device configured to emit illumination light and a display section configured to display an image based on the illumination light from the light source device. The light source device includes: a substrate; a plurality of light sources disposed on the substrate; a wavelength conversion member disposed to face the plurality of light sources; and a diffusion member disposed between the wavelength conversion member and the plurality of light sources, and configured to uniformize distribution of traveling direction angle of incident light.

In the light source device and the display unit according to the respective embodiments of the disclosure, the distribution of the traveling direction angle of the incident light is uniformized by the diffusion member disposed between the wavelength conversion member and the plurality of light sources.

In the light source device and the display unit according to the respective embodiments of the disclosure, the diffusion member is disposed between the wavelength conversion member and the plurality of light sources. Therefore, it is possible to improve quality of illumination light.

Note that the effects described here are not necessarily limited, and any effect described in the present disclosure may be obtained.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, preferred embodiments of the disclosure will be described in detail with reference to drawings. Note that description will be given in the following order:
1. First embodiment (a structure example in which a diffusion member is disposed)
   1.1 Structure
   1.2 Function
   1.3 Effects
   1.4 Modification of first embodiment
   1.4.1 First modification (a structure example in which a diffuser with a shaped surface is disposed as a diffusion member)
   1.4.2 Second modification (a structure example in which direct potting type light sources are disposed)
2. Second embodiment (a structure example in which a prism sheet is additionally disposed)
   2.1 Structure
   2.2 Function and effects
3. Third embodiment (a structure example in which a cut filter is additionally disposed)
   3.1 Structure and function
   3.2 Modification of third embodiment
4. Numerical examples
5. Other embodiments

1. First Embodiment (1.1 Structure)

Figure 1:
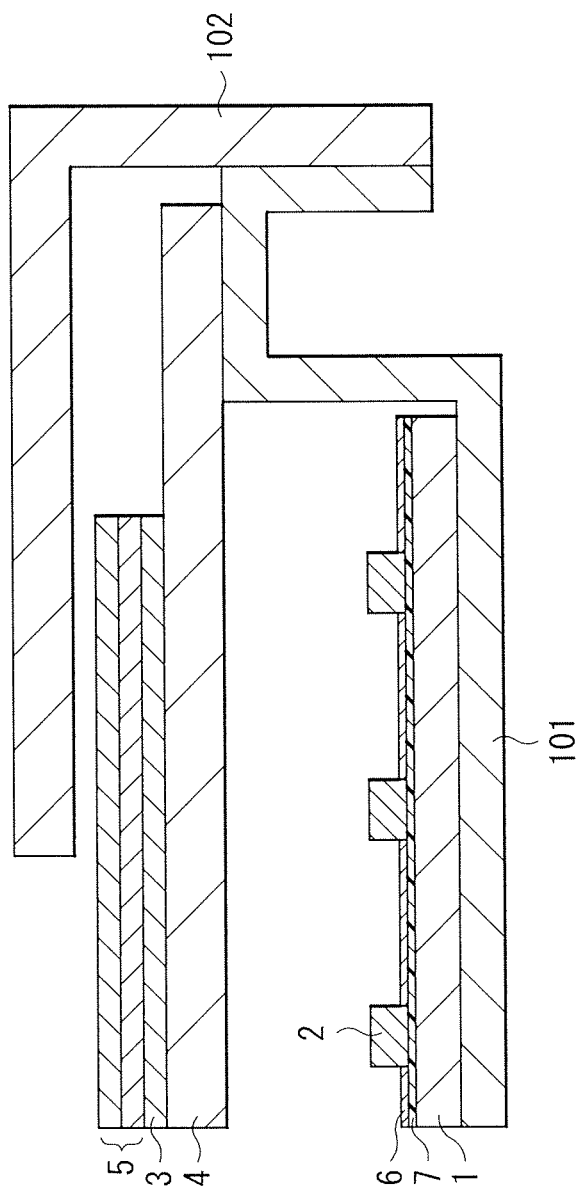
FIG. 1 is a sectional diagram illustrating a structure example of a light source device according to a first embodiment of the disclosure.
Figure 2:
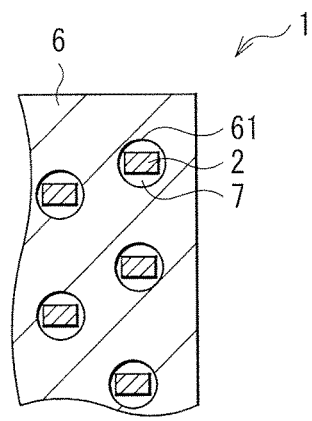
FIG. 2 is a plan view illustrating an example of an in-plane arrangement of light sources in the light source device according to the first embodiment.
Figure 3:
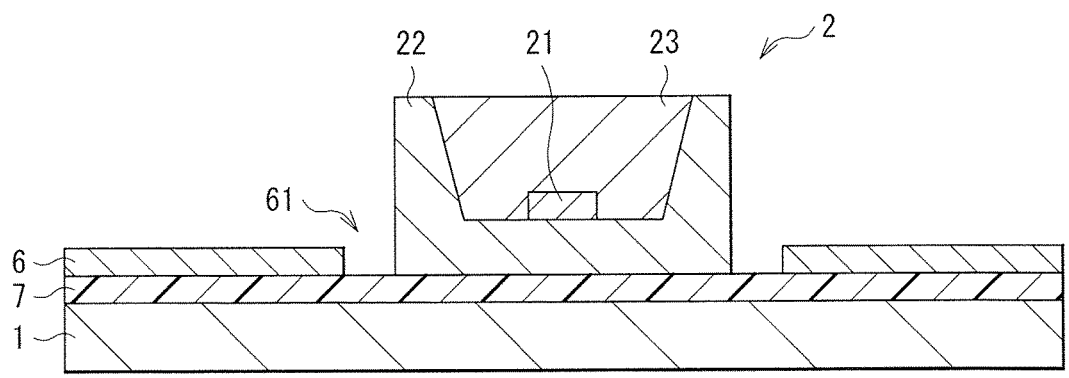
FIG. 3 is a sectional diagram illustrating a structure example of the light source and its surroundings in the light source device according to the first embodiment.
Figure 4:
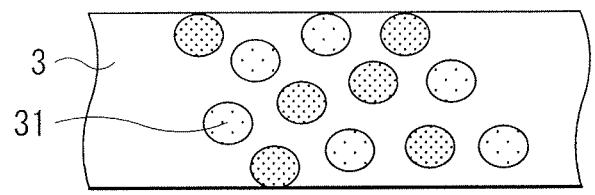
FIG. 4 is a sectional diagram illustrating a structure example of a wavelength conversion sheet in the light source device according to the first embodiment.

FIG. 1 illustrates a structure example of a light source device according to a first embodiment of the disclosure. FIG. 2 illustrates an example of an in-plane arrangement of light sources 2 of the light source device. FIG. 3 illustrates a structure example of the light source 2 and its surroundings. FIG. 4 illustrates a structure example of a wavelength conversion sheet 3 of the light source device. The light source device is suitable as a planar light source, and may be used as, for example, a direct type backlight.

The light source device includes a light source substrate 1, a plurality of light sources 2, the wavelength conversion sheet 3 serving as a wavelength conversion member, a diffusion member 4, an optical sheet 5, a reflective sheet 6 serving as a reflection member, a resist layer 7, a back chassis 101, and a middle chassis 102.

The light source substrate 1 is disposed on a bottom surface of the back chassis 101. The back chassis 101 has a shape in which a peripheral part folded upward, and the middle chassis 102 is attached to an end of the peripheral part. In the peripheral part of the back chassis 101, a flat part is formed inside the part attached to the middle chassis 102, and a peripheral part of the diffusion member 4 is supported by the flat part. The wavelength conversion sheet 3 and the optical sheet 5 are disposed on a light emission surface (a front surface) side of the diffusion member 4. When the light source device is applied to a display unit, a display panel may be disposed on a light emission surface (a front surface) side of the optical sheet 5. In such a case, a peripheral part of the display panel may be supported by the middle chassis 102.

The wavelength conversion sheet 3 is disposed so as to face the plurality of light sources 2. The diffusion member 4 is disposed between the wavelength conversion sheet 3 and the plurality of light sources 2. The diffusion member 4 is to uniformize distribution of traveling direction angle of incident light. As the diffusion member 4, one diffusion plate or one diffusion sheet may be used, or two or more diffusion plates or two or more diffusion sheets may be used.

The optical sheet 5 is disposed on a light emission surface (a front surface) side of the wavelength conversion sheet 3. For example, the optical sheet 5 may be formed of a sheet or a film to improve luminance. For example, the optical sheet 5 may include a prism sheet. In addition, the optical sheet 5 may include a reflection type polarization film such as a dual brightness enhancement film (DBEF).

On the light source substrate 1, a not illustrated wiring pattern is formed to allow independent light emission control for every one or every two or more light sources 2. Therefore, local light emission control (local dimming) of the plurality of light sources 2 is allowed to be performed. As the light source substrate 1, a resin film such as polyethylene terephthalate (PET), fluorine, and polyethylene naphthalate (PEN) that is printed with a wiring pattern may be used. In addition, a metal base substrate such as aluminum (Al) that has a polyimide or epoxy-based insulation resin layer on a surface and is printed with a wiring pattern of a material having a light reflectivity on the insulation resin layer may be used. Moreover, a film substrate formed of a glass-containing resin such as glass epoxy resin (FR4) and glass composite resin (CEM3) on which a wiring pattern of the material having light reflectivity is printed may be used. Examples of the material having light reflectivity may include, for example, Al, silver (Ag), and an alloy thereof.

The resist layer 7 and the reflective sheet 6 are disposed in order on the light source substrate 1. The reflective sheet 6 is disposed in an in-plane region that is different from in-plane regions provided with the plurality of light sources 2 on the light source substrate 1.

The resist layer 7 is a white resist layer relatively high in reflectance to light from the light sources 2 and light that is wavelength-converted by the wavelength conversion sheet 3. Examples of white resist may include, for example, inorganic materials such as titanium oxide ($TiO_2$) microparticles and barium sulfate ($BaSO_4$) microparticles, and organic materials such as porous acrylic resin microparticles having myriad of holes for light scattering, and polycarbonate resin microparticles.

The reflective sheet 6 has a high reflectance to the light from the light sources 2 and the light that is wavelength-converted by the wavelength conversion sheet 3. The reflective sheet 6 may contain Ag as a material having high reflectance. As illustrated in FIG. 2 and FIG. 3, through holes 61 to dispose the light sources 2 are formed in the reflective sheet 6.

In the in-plane region provided with the through holes 61, the resist layer 7 is exposed around the light sources 2. Therefore, the outermost surface of the light source substrate 1 is the reflective sheet 6 in the in-plane region other than the through holes 61, and is the light sources 2 and the resist layer 7 in the in-plane regions provided with the through holes 61.

As illustrated in FIG. 2, the light sources 2 are two-dimensionally arranged on the light source substrate 1. As illustrated in FIG. 3, each of the light sources 2 includes a light emitting element 21, a package 22, and a sealant 23. The package 22 has a concave housing part, and the light emitting element 21 is disposed on a bottom surface of the concave housing part. The concave housing part is filled with the sealant 23. For example, the light emitting element 21 may be a point light source, and specifically configured of an LED. The package 22 is mounted on the light source substrate 1 by solder or the like, through an external electrode formed of lead frame or the like (not illustrated). A front surface of the concave housing part of the package 22 may preferably have high reflectance to light from the light emitting element 21. The front surface of the concave housing part may contain, for example, Ag as a material having high reflectance. For example, the sealant 23 may be formed of a transparent resin such as silicone and acryl.

As illustrated in FIG. 4, the wavelength conversion sheet 3 includes a wavelength conversion material 31. For example, the wavelength conversion material 31 may contain fluorescent substance (fluorescent material) such as fluorescent pigment and fluorescent dye, or quantum dots. The wavelength conversion material 31 is excited by the light from the light sources 2, and converts a wavelength of the light from the light sources 2 into a different wavelength through principle of fluorescent light emission or the like, and emits the light.

The light source 2 may be, for example, a blue light source (for example, wavelength of 440 nm to 460 nm), and the wavelength conversion material 31 absorbs blue light from the light source 2 and converts part of the absorbed light into red light (for example, wavelength of 620 nm to 750 nm) or green light (for example, wavelength of 495 nm to 570 nm). In this case, when the light from the light source 2 passes through the wavelength conversion material 31, red, green, and blue light are synthesized to generate white light. Moreover, the wavelength conversion material 31 may absorb the blue light to convert part of the absorbed light into yellow light. In this case, when the light from the light source 2 passes through the wavelength conversion material 31, yellow and blue light are synthesized to generate white light.

The wavelength conversion material 31 may preferably contain the quantum dots. The quantum dots are particles each having a diameter of about 1 nm to about 100 nm, and have discrete energy level. Since the energy state of the quantum dots depends on the size, changing the size makes it possible to freely select light emission wavelength. Moreover, light emitted from the quantum dots has a narrow spectrum width. Color gamut is expanded by combination of such light having steep peak. Therefore, using the quantum dots for the wavelength conversion material 31 makes it possible to easily expand the color gamut. Further, the quantum dots have high responsiveness, which makes it possible to efficiently utilize the light from the light sources 2. In addition, the quantum dots have high stability. For example, the quantum dots may be a compound of group 12 elements and group 16 elements, a compound of group 13 elements and group 16 elements, or a compound of group 14 elements and group 16 elements, and may be, for example, CdSe, CdTe, ZnS, CdS, PbS, PbSe, CdHgTe, or the like.

(1.2 Function)
(Function of Entire Light Source Device)

Figure 5:
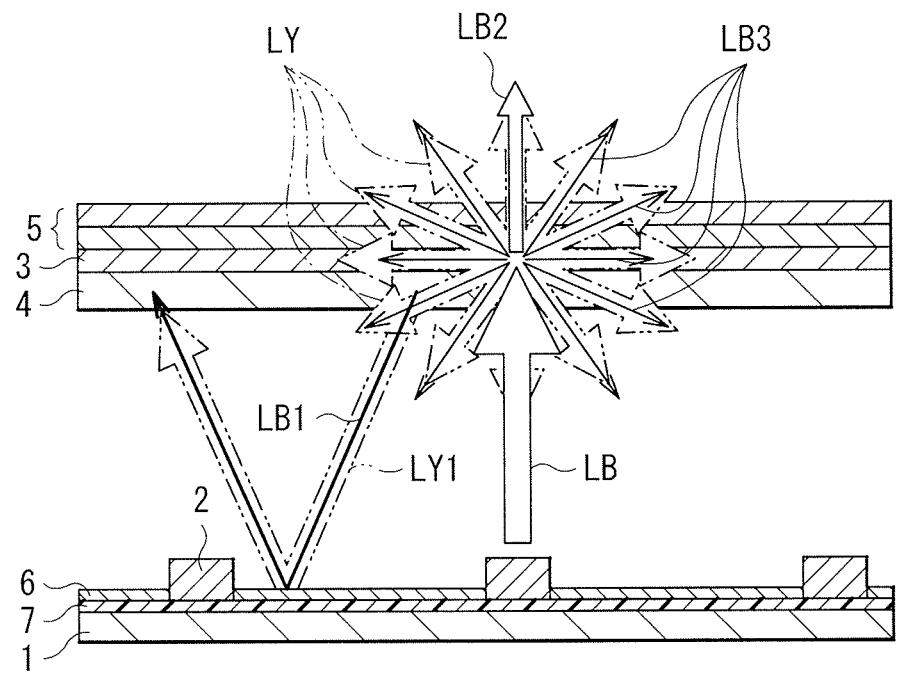
FIG. 5 is a sectional diagram illustrating an example of a traveling state of light in the inside of the light source device according to the first embodiment.

FIG. 5 illustrates an example of a traveling state of light in the inside of the light source device. In the light source device, part of light LB (for example, blue light) emitted from the light source 2 becomes light LY that is wavelength-converted (is emitted) by the wavelength conversion material (FIG. 4) in the wavelength conversion sheet 3. The wavelength-converted light LY may be, for example, red light and green light, or yellow light. The wavelength-converted light LY is averagely and uniformly reflected and emitted in all directions from the wavelength conversion sheet 3. Out of the light LB emitted from the light source 2, light LB3 that collides against the wavelength conversion material 31 and is not absorbed is also averagely and uniformly reflected and emitted in all directions from the wavelength conversion sheet 3. Out of the light LB emitted from the light source 2, light LB2 that does not collide against the wavelength conversion material 31 is emitted as it is from the wavelength conversion sheet 3. Light directed frontward out of the light LB2 and LB3 that are not wavelength-converted and light directed frontward out of the wavelength-converted light LY are synthesized to generate white light, and the white light is emitted frontward (to the outside of the light source device).

Moreover, part of the light LB2 and LB3 that are not wavelength-converted becomes light (downward light LB1) directed rearward (the substrate 1 side) from the wavelength conversion sheet 3. Furthermore, part of the light directed frontward out of the light LB2 and LB3 that are not wavelength-converted becomes recurrent light by the optical sheet 5 such as DBEF, and becomes the downward light LB1. The downward light LB1 is reflected by the front surface (mainly the reflective sheet 6) of the light source substrate 1 and directs toward the wavelength conversion sheet 3 again, and part thereof is wavelength-converted. Likewise, downward light LY1 out of the wavelength-converted light LY is reflected by the front surface of the light source substrate 1 and thus becomes light directed frontward. In this way, the downward light LB1 and LY1 are reflected by the front surface of the light source substrate 1, and thus become recycle light to generate white light. The recycle of the downward light LB1 and LY1 may be performed, for example, four or five times in some cases.

Therefore, final luminance of the white light emitted from the light source device is obtained from the light containing the recycle light.

(Function of Diffusion Member 4)

Figure 6:
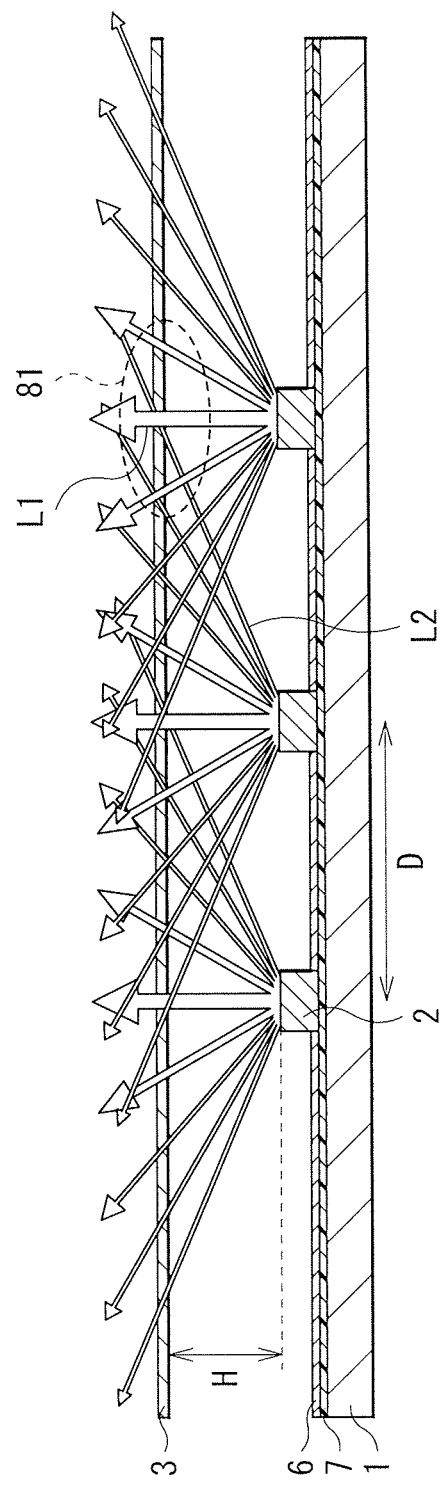
FIG. 6 is an explanatory diagram illustrating a first example of the traveling state of light that enters the wavelength conversion sheet from the light sources.
Figure 7:
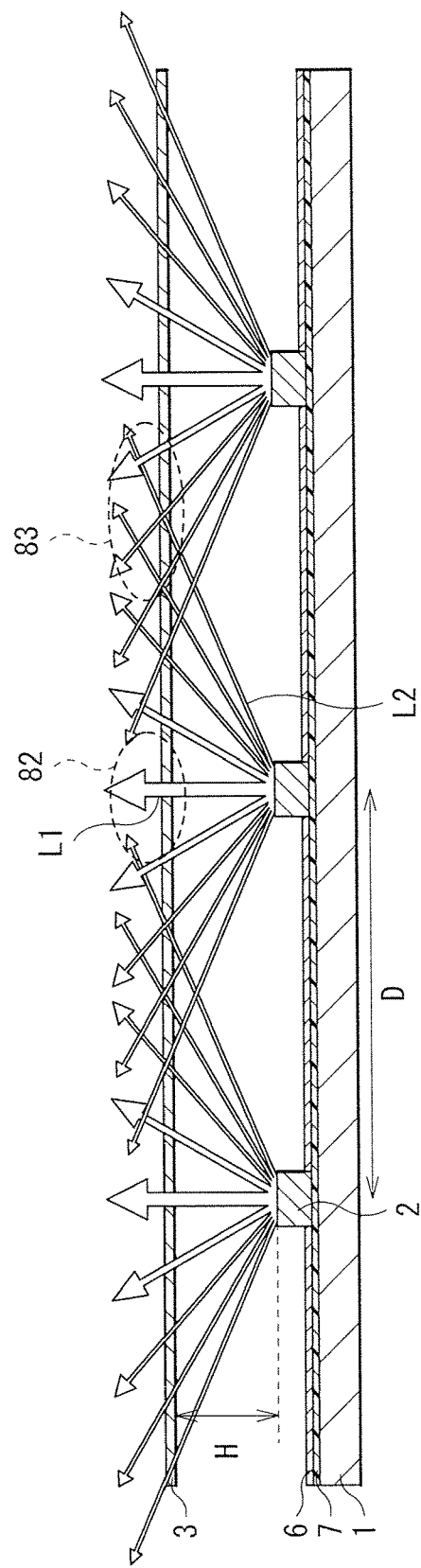
FIG. 7 is an explanatory diagram illustrating a second example of the traveling state of the light that enters the wavelength conversion sheet from the light sources.
Figure 8:
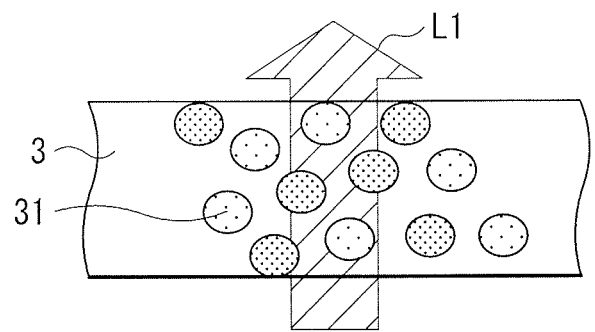
FIG. 8 is a sectional diagram illustrating the traveling state of light that enters the wavelength conversion sheet from a vertical direction.
Figure 9:
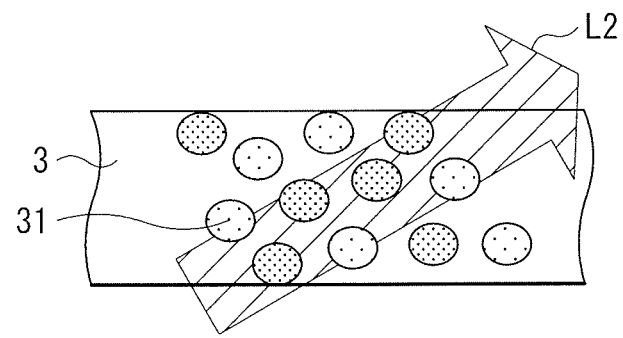
FIG. 9 is a sectional diagram illustrating the traveling state of light that enters the wavelength conversion sheet from an oblique direction.
Figure 10:
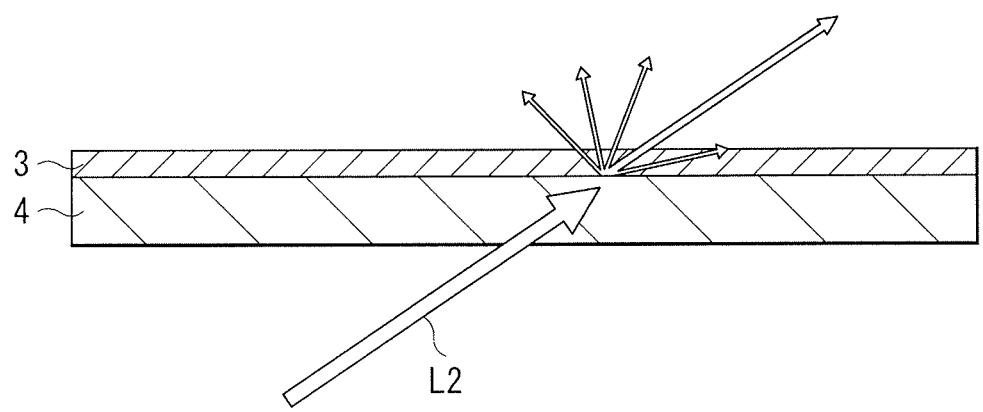
FIG. 10 is a sectional diagram illustrating a function of a diffusion member in the light source device according to the first embodiment.

A function of the diffusion member 4 is described with reference to FIG. 6 to FIG. 10. FIG. 6 illustrates a first example of the traveling state of the light that enters the wavelength conversion sheet 3 from the light sources 2. FIG. 7 illustrates a second example of the traveling state of the light that enters the wavelength conversion sheet 3 from the light sources 2. FIG. 6 and FIG. 7 each illustrate a structure from which the diffusion member 4 is omitted. FIG. 8 illustrates the traveling state of light that enters the wavelength conversion sheet 3 from a vertical direction. FIG. 9 illustrates the traveling state of light that enters the wavelength conversion sheet 3 from an oblique direction. FIG. 10 illustrates the function of the diffusion member 4.

FIG. 6 illustrates a case where an arrangement distance D of the plurality of light sources 2 is optimized to an appropriate distance as well as a distance H between the plurality of light sources 2 and the wavelength conversion sheet 3 is optimized to an appropriate value. In this case, in the wavelength conversion sheet 3, for example, in a region 81 directly above the light source 2, a vertical component L1 and an oblique component L2 of the light from the light source 2 are uniformly mixed to generate white light. In the case where the diffusion member 4 is not disposed, to establish a state where the vertical component L1 and the oblique component L2 of the light from the light source 2 are uniformly mixed, it is necessary to make the arrangement distance D of the plurality of light sources 2 small to some extent. In addition, it is necessary to make the distance H between the plurality of light sources 2 and the wavelength conversion sheet 3 long to some extent.

On the other hand, FIG. 7 illustrates a case where the arrangement distance D of the plurality of light sources 2 is larger and the distance H between the plurality of light sources 2 and the wavelength conversion sheet 3 is smaller, as compared with the state in FIG. 6. In this case, for example, in a region 82 directly above the light source 2, a ratio of the oblique component L1 of the light from the light source 2 may become large. In addition, for example, in a region 83 deviated from directly above the light source 2, a ratio of the oblique component L2 of the light from the light source 2 may become large. In this case, as illustrated in FIG. 8 and FIG. 9, a difference occurs between an optical path through which the vertical component L1 passes and an optical path through which the oblique component L2 passes, in the inside of the wavelength conversion sheet 3, which results in difference in a ratio at which the light collides against the wavelength conversion material 31. Therefore, difference occurs in the ratio of the light wavelength-converted by the wavelength conversion material 31. Since the optical path through which the oblique component L2 passes is longer than the optical path through which the vertical component L1 passes, the ratio of the light wavelength-converted by the wavelength conversion material 31 becomes large. Accordingly, color unevenness in which chromaticity is different between the region 82 directly above the light source 2 and the region 83 deviated from directly above the light source 2 occurs.

Displacement of the diffusion member 4 on the light incident side of the wavelength conversion sheet 3 makes it possible to suppress occurrence of the above-described color unevenness. For example, as illustrated in FIG. 10, when the oblique component L2 enters the diffusion member 4, the light is diffused, and the distribution of the traveling direction angle of the light is uniformized to some extent. As a result, the ratio of the oblique component L2 is reduced, and occurrence of the color unevenness is suppressed.

(1.3 Effects)

As described above, in the first embodiment, the diffusion member 4 is provided between the wavelength conversion sheet 3 and the plurality of light sources 2. Therefore, it is possible to suppress occurrence of color unevenness and to improve quality of illumination light.

Note that the effects described in the present specification are merely examples without limitation, and other effects may be obtainable.

(1.4 Modifications of First Embodiment)

(1.4.1 First Modification)

(Structure)

Figure 11:
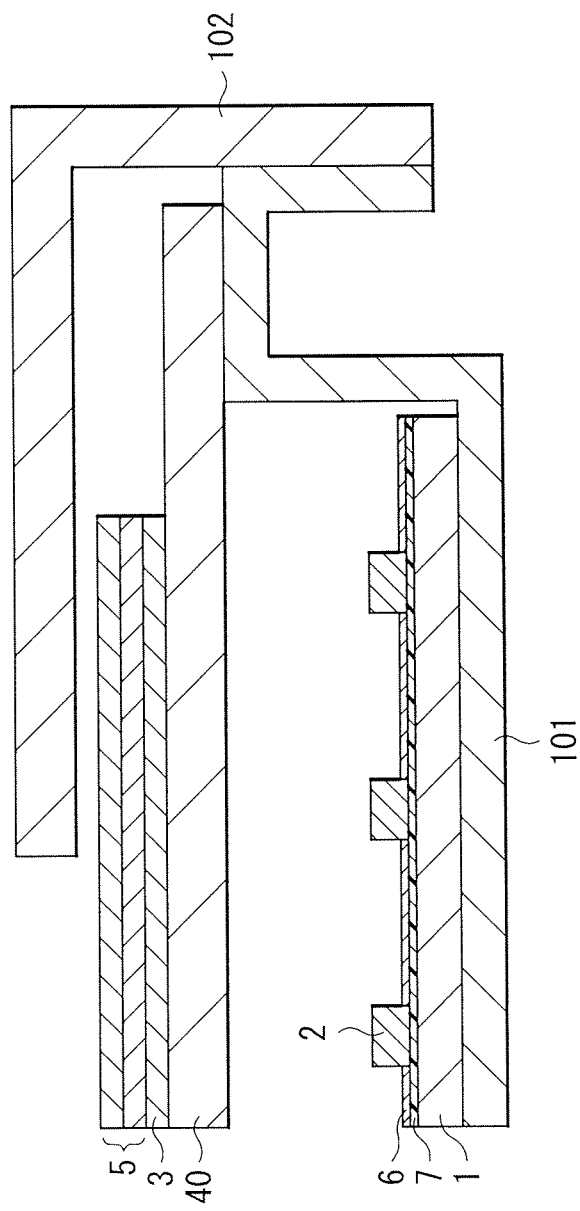
FIG. 11 is a sectional diagram illustrating a structure example of a light source device according to a first modification of the first embodiment.

FIG. 11 illustrates a structure example of a light source device according to a first modification of the first embodiment. The first modification has a structure substantially similar to the structure in FIG. 1 except that a diffuser with a shaped surface 40 is provided as the diffusion member 4. The diffuser with the shaped surface 40 has optical elements each having a predetermined shape. The optical elements are two-dimensionally formed (molded) on a front surface of the diffuser with the shaped surface 40. The diffuser with the shaped surface 40 is disposed so that a side provided with the optical elements each having the predetermined shape faces to the wavelength conversion sheet 3.

Figure 12:
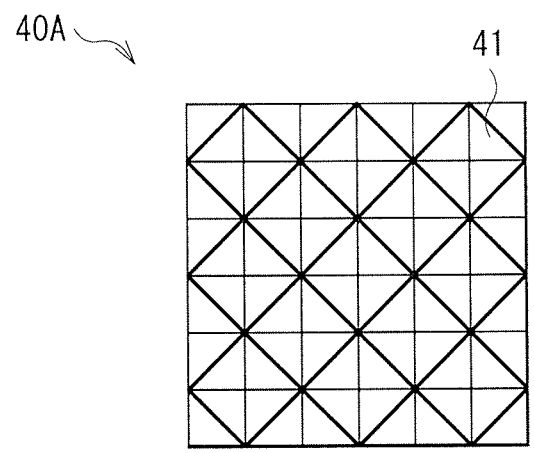
FIG. 12 is a plan view illustrating a first structure example of a diffuser with a shaped surface.
Figure 13:
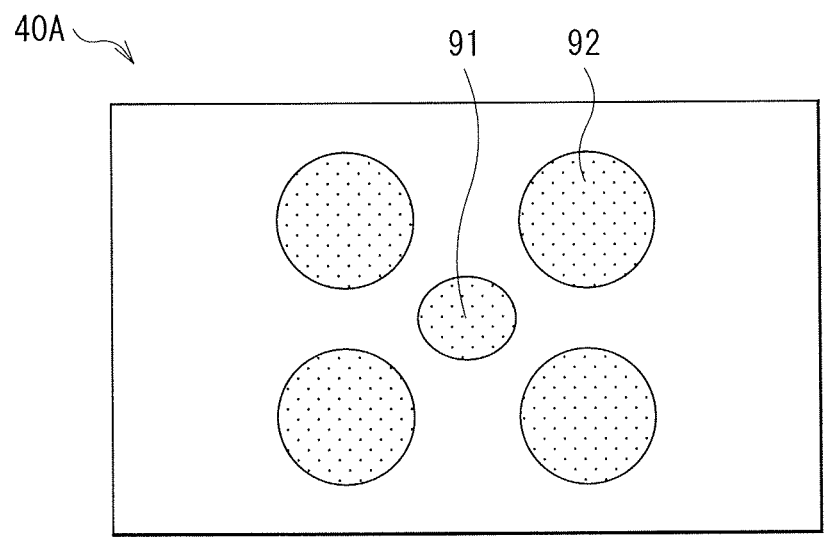
FIG. 13 is a plan view illustrating an example of a light source image formed by the diffuser with the shaped surface illustrated in FIG. 12.

FIG. 12 illustrates a first structure example of the diffuser with the shaped surface 40. FIG. 13 illustrates an example of a light source image formed by a diffuser with a shaped surface 40A illustrated in FIG. 12. In the structure example of the diffuser with the shaped surface 40A, fine square pyramid-shaped convex patterns are two-dimensionally formed as the optical elements each having a predetermined shape. In such a diffuser with the shaped surface 40A, the light source image from one light source 2 is blanched to four images and collected, by refraction function of the plurality of square pyramid-shaped convex patterns. As a result, as illustrated in FIG. 13, a light source image 91 for one light source 2 appears directly above the light source 2 on the diffuser with the shaped surface 40A and four collected-light images 92 appear around the light source image 91, and thus it seems as if the number of light sources 2 is increased fivefold.

Figure 14:
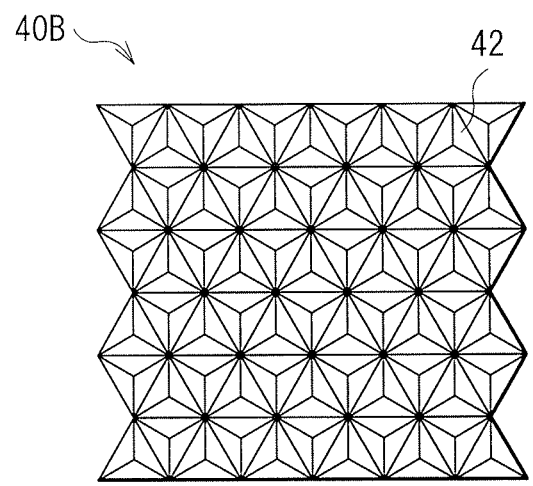
FIG. 14 is a plan view illustrating a second structure example of the diffuser with the shaped surface.
Figure 15:
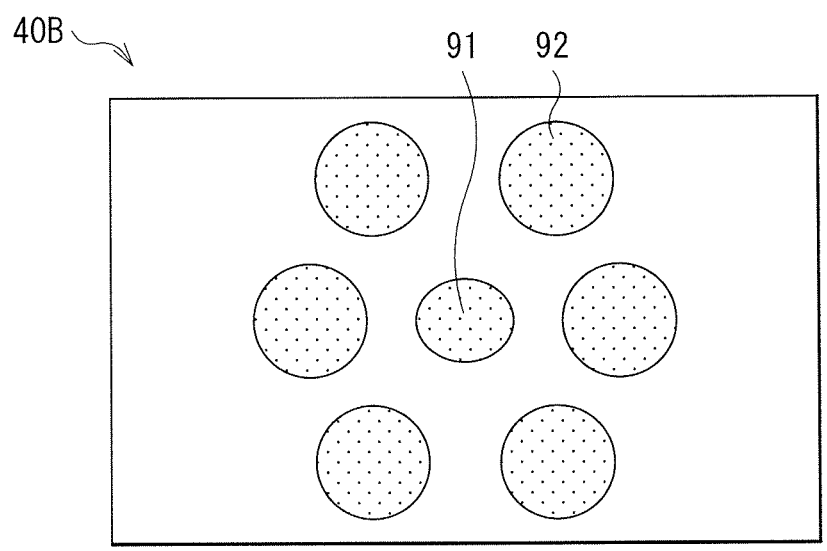
FIG. 15 is a plan view illustrating an example of a light source image formed by the diffuser with the shaped surface illustrated in FIG. 14.

FIG. 14 illustrates a second structure example of the diffuser with the shaped surface 40. FIG. 15 illustrates an example of a light source image formed by a diffuser with a shaped surface 40B illustrated in FIG. 14. In the structure example of the diffuser with the shaped surface 40B, fine triangular pyramid-shaped convex patterns are two-dimensionally formed as the optical elements each having a predetermined shape. In such a diffuser with the shaped surface 40B, by refraction function by the plurality of triangular pyramid-shaped convex patterns, as illustrated in FIG. 15, the light source image 91 for one light source 2 appears directly above the light source 2 on the diffuser with the shaped surface 40B and six collected-light images appear around the light source image 91, and thus it seems as if the number of light sources 2 is increased sevenfold.

(Function and Effects)

Function and Effects obtained by using the diffuser with the shaped surface 40 are described below.

When the diffuser with the shaped surface 40 is omitted from the structure, in the wavelength conversion sheet 3, luminance difference occurs between a region directly above the light source 2 and a region between adjacent light sources 2, and luminance unevenness occurs. Hereinafter, such luminance unevenness is referred to as "granular unevenness". To dissolve the granular unevenness, there is a method in which a post-attached lens 24 is provided to the light source 2 as with a light source device according to a comparative example illustrated in FIG. 16. Also in the light source device according to the comparative example, as with the case described with use of FIG. 5, the downward light LB1 and LY1 from the wavelength conversion sheet 3 and the optical sheet 5 are reflected by the reflective sheet 6 on the light source device 1, and are used as recycle light to generate white light. However, when the post-attached lens 24 is provided on the light source 2, it is necessary to increase the size of the through hole 61 (see FIG. 2 and FIG. 3) provided on the reflective sheet 6 by the size of the post-attached lens 24. Therefore, as compared with a case where the post-attached lens 24 is not provided on the light source 2, an area of the reflective sheet 6 is decreased, which reduces utilization efficiency of the recycle light. Accordingly, degradation in entire luminance occurs.

Figure 16:
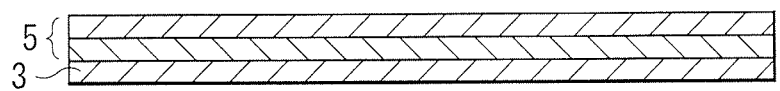
FIG. 16 is a sectional diagram illustrating a structure example of a light source device according to a comparative example.
Figure 16:
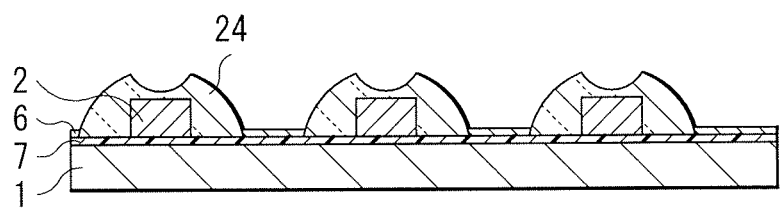

On the other hand, when the diffuser with the shaped surface 40 is used, the apparent number of light sources 2 is allowed to be increased as described above. Therefore, it is possible to dissolve the granular unevenness without using the post-attached lens 24 as illustrated in FIG. 16. In this case, since the post-attached lens 24 is not used, decrease in area of the reflective sheet 6 as described above does not occur. Accordingly, it is possible to dissolve the granular unevenness without degrading the entire luminance, as compared with the case where the post-attached lens 24 is used.

(1.4.2 Second Modification)
(Structure)

Figure 17:
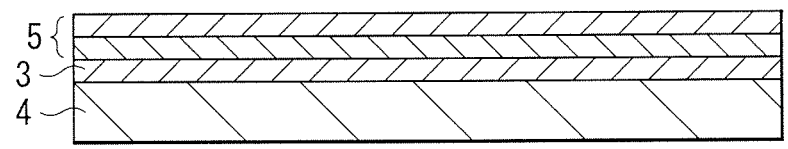
FIG. 17 is a sectional diagram illustrating a structure example of a light source device according to a second modification of the first embodiment.
Figure 17:
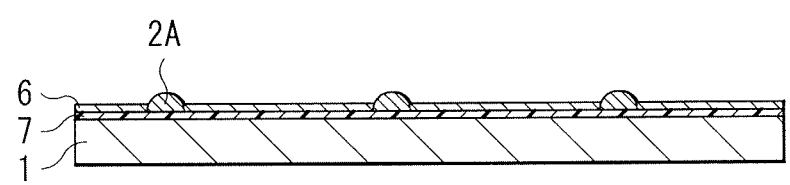
Figure 18:
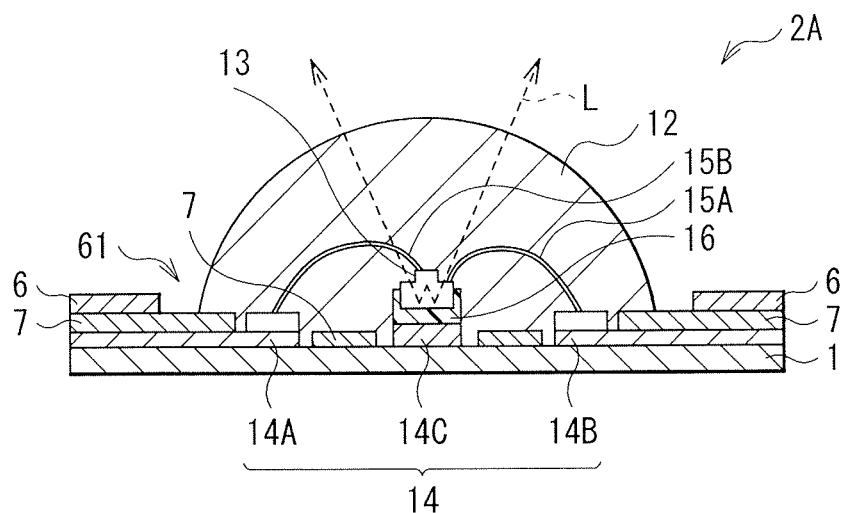
FIG. 18 is a sectional diagram illustrating a structure example of a light source of the light source device according to the second modification of the first embodiment.

FIG. 17 illustrates a structure example of a light source device according to a second modification of the first embodiment. The second modification has a structure substantially similar to the structure example in FIG. 1 except that a direct potting type light sources 2A are disposed. FIG. 18 illustrates a structure example of each of the direct potting type light sources 2A. The direct potting type light source 2A has a structure in which a light emitting element chip 13 (for example, an LED dice) is only potted on the light source substrate 1 by a sealant, and is decreased in an area as compared with the packaged light source 2 as illustrated in FIG. 3. The light source 2A includes the light emitting element chip 13 and a sealing lens 12 formed by a sealant that seals the light emitting element chip 13 on the light source device 1.

In the structure example illustrated in FIG. 18, a light reflective wiring pattern 14 is formed on the front surface of the light source device 1. For example, the wiring pattern 14 may include a wiring layer 14A and a wiring layer 14B that are to supply a drive current to the light emitting element chip 13 and a chip mounting layer 14C that is to mount the light emitting element chip 13. The wiring layers 14A and 14B and the chip mounting layer 14C are formed of a material having conductivity and light reflectivity by the same step, and are electrically independent of one another. Note that the chip mounting layer 14C may have only a function as a base of the light emitting element chip 13 and may not have a function as a wiring. In this case, for example, "light reflectivity" indicates a case where a material has a reflectance to light (back surface emitted light) emitted from the light emitting element chip 13 equal to or higher than 90%, and specific examples of the material having such light reflectivity may include, for example, Al, Ag, and an alloy thereof.

The light emitting element chip 13 is electrically connected to the wiring layers 14A and 14B through wirings (bonding wires) 15A and 15B such as Al and Ag. The light emitting element chip 13 is driven by a current flowing through the wiring layers 14A and 14B and the wirings 15A and 15B, and emits light.

The light emitting element chip 13 is mounted directly on the chip mounting layer 14C. In this case, "directly" indicates that the back surface of the light emitting element chip 13 is bonded to the chip mounting layer 14C by die bonding or the like without packaging the light emitting element chip 13 or providing a reflective layer such as a tin or gold plating layer between the chip mounting layer 14C and the light emitting element chip 13. However, an adhesive layer such as transparent paste 16 for die bonding may be interposed between the chip mounting layer 14C and the light emitting element chip 13. Incidentally, although the transparent paste 16 does not have conductivity, when an LED chip having electrodes on both surfaces is used, the transparent paste 16 may have conductivity because the chip mounting layer 14C has a function as a current path.

For example, the resist layer 7 may be formed as a solid film on the entire surface of the light source substrate 1 other than a region mounted with the light emitting element chip 13 and a region where the light emitting element chip 13 is connected to the wiring layers 14A and 14B. The reflective sheet 6 is disposed on the resist layer 7. As with the structure example of FIG. 2 and FIG. 3, the through holes 61 where the light sources 2A are disposed are formed on the reflective sheet 6. In the in-plane region provided with the through holes 61, the resist layer 7 is exposed around the light sources 2A. Therefore, the outermost surface of the light source substrate 1 is the reflective sheet 6 in the in-plane region other than the through holes 61, and is the light sources 2A and the resist layer 7 in the in-plane region provided with the through holes 61.

The sealing lens 12 protects the light emitting element chip 13 and improves extraction efficiency of light L emitted from the light emitting element chip 13. The sealing lens 12 is formed of a sealant (for example, a transparent resin such as silicone and acryl) so as to cover the entire light emitting element chip 13.

The sealing lens 12 is formed in a dome lens shape by the sealant. For a reason described later, in terms of a height h and a radius r of the dome lens shape, the sealing lens 12 may preferably satisfy the condition of $0.65 \leq h/r \leq 1$.

In the light source 2A, the light emitted from the light emitting element chip 13 is extracted frontward through the sealing lens 12, and part of the light travels from the back surface side of the light emitting element chip 13 to the light source substrate 1 side (the back surface emitted light). The back surface emitted light L is reflected by the front surface of the chip mounting layer 14 that is mounted with the light emitting element chip 13 and has a high light reflection function, and is then extracted frontward as illustrated in FIG. 18.

(Function and Effects)

A function and effects obtained by using the direct potting type light sources 2A is described below.

In a normal planar light source device, for example, a white LED package in which a sealant mixed with a fluorescent substance that converts a wavelength of light into a wavelength of yellow, or green and red is mounted on a blue LED chip is used as the light source. In this case, light emitted from (wavelength-converted by) the fluorescent substance is emitted in all directions. In addition, blue light that is not absorbed by the fluorescent substance and is reflected by the surface of the fluorescent substance is also reflected in all directions. In other words, the sealant itself functions as the fluorescent substance, and the extraction efficiency of light from the LED package is not greatly varied depending on the sealant, namely, the lens shape. However, in the present embodiment, as with the structure example in FIG. 1 and FIG. 3, when the wavelength conversion sheet 3 is oppositely disposed separately from the light source 2 and the translucent sealant 23 is used for the light source 2, the outer shape of the sealant 23 has a large implication of a function as a lens to extract light emitted from the light emitting element 21. At this time, a lens shape of a current typical white LED package is substantially flat. When the blue LED package having the shape of the white package, in which only the fluorescent substance is eliminated from the sealant is combined as the light source 2 with the wavelength conversion sheet 3, extraction efficiency of blue light is deteriorated and thus luminance is not increased.

In the case where the above-described blue LED package is considered to be used as the light source 2 to be combined which makes it possible to suppress reflection between the light emitting element chip 13 and the sealant to further increase the luminance efficiency. Furthermore, it is possible to achieve dome-shaped LED package at a price lower than that of a normal LED package that is not of the direct potting type.

Table 1 illustrates a comparison results between the extraction efficiency of the blue light in the case where the direct potting type light source 2A is used and the extraction efficiency of the blue light in the case where the normal LED package (the normal PKG) that is not of the direct potting type. PKG indicates a package. The blue LED chip is used as the light emitting element chip 13, and silicone is used as the sealant. As is apparent from Table 1, when the lens shape is formed in a dome shape, the extraction efficiency is improved. In addition, when the aspect ratio is close to 1, the extraction efficiency is improved. As a result, when the direct potting type light source 2A according to the present modification is used, the extraction efficiency of the blue light is improved, and thus luminance efficiency is increased.

TABLE 1

| PKG shape | Chip size (μm) | Lens shape | Aspect ratio | Refractive index of sealant | Efficiency before sealing (μW/W) | Efficiency after sealing (μW/W) | Extraction efficiency | Efficiency ratio |
|---|---|---|---|---|---|---|---|---|
| Direct Potting | 350 × 550 | Dome | 0.85 | 1.52 | 324712 | 398494 | 123% | 1 |
|  |  |  | 0.65 | 1.52 |  | 375367 | 116% | 0.94 |
| Normal PKG | 335 × 575 | Plane | 0 | 1.41 | 272851 | 264556 | 97% | 0.79 |
|  |  |  | 0 | 1.52 | 231332 | 203341 | 88% | 0.72 |
|  |  | Dome | 0.55 | 1.41 | 272851 | 312700 | 115% | 0.93 |
|  |  |  | 0.55 | 1.52 | 277962 | 283700 | 102% | 0.83 | with the wavelength conversion sheet 3, a lens (a sealant) on the normal LED package mainly has a flat shape. Although a small number of dome lenses are produced, an aspect ratio thereof is typically about 0.5 to about 0.6. In this example, the aspect ratio is a ratio of the height h and the radius r of the dome lens shape, namely, h/r. When the aspect ratio is 1, the shape is hemisphere shape.

In the case of the above-described blue LED package, the blue light is emitted from an LED chip smaller than the lens diameter. Therefore, in the case where the LED chip is assumed to be a point light source to the lens, in a flat lens shape, for example, when a refractive index of silicone as the lens material is assumed to be n=1.45, light at an angle of θ=43.6 degrees or more that is emitted from the LED chip is totally reflected and is returned to a bottom side, and is emitted to the outside of the package after being repeatedly reflected by side walls or a bottom surface in the package. In this way, since the part of light is repeatedly reflected in the package, which results in degradation of luminance efficiency. In contrast, in the LED package having the hemispherical dome lens, most of the light emitted from the LED chip located at the center of the lens directs in a normal direction to the lens outer shape, and therefore, the light is scarcely reflected and is emitted as it is. Accordingly, luminance efficiency becomes high.

Since the light source 2A according to the present modification has the direct potting type structure, the sealing lens 12 is easily formed in a dome shape having an aspect ratio of 0.65 or more and 1 or less, and thus the luminance efficiency is allowed to be increased. Moreover, the refractive index of the sealant (for example, silicone) is increased to be close to the refractive index of the base material (for example, sapphire) of the light emitting element chip 13, Also in the light source device according to a second embodiment, as with the case described with use of FIG. 5, the downward light LB1 and LY1 from the wavelength conversion sheet 3 and the optical sheet 5 are reflected by the reflective sheet 6 on the light source substrate 1 to be used as recycle light to generate white light. At this time, in the case where the direct potting type light source 2A is used, the package area is allowed to be smaller than that of the normal LED package. Therefore, the size of the through hole 61 provided on the reflective sheet 6 is allowed to be reduced by that amount. Accordingly, as compared with the case where the normal LED package is used, the area of the reflective sheet 6 is allowed to be increased, which makes it possible to increase utilization efficiency of the recycle light. As a result, it is possible to improve luminance of the entire light source device.

2. Second Embodiment (2.1 Structure)

Figure 19:
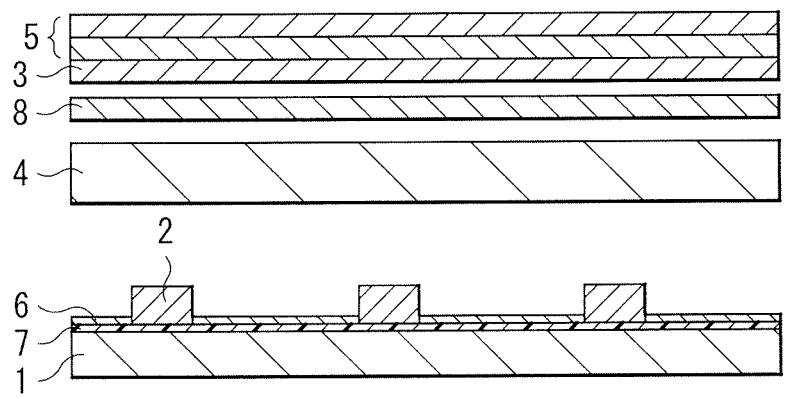
FIG. 19 is a sectional diagram illustrating a structure example of a light source device according to a second embodiment.

FIG. 19 illustrates a structure example of a light source device according to a second embodiment. The light source device according to the second embodiment has a structure substantially similar to the structure of FIG. 1 except that a prism sheet 8 is additionally disposed between the wavelength conversion sheet 3 and the diffusion member 4.

Figure 20:
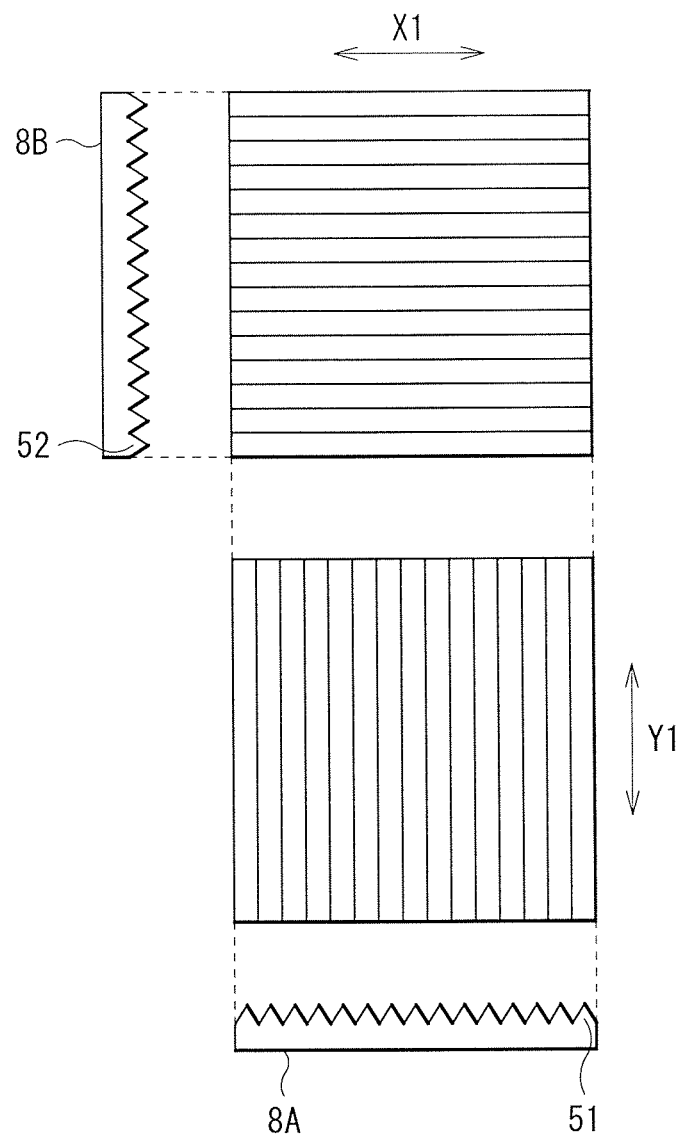
FIG. 20 is a sectional diagram and a plan view each illustrating a structure example of a prism sheet in the light source device according to the second embodiment.

FIG. 20 illustrates a structure example of the prism sheet 8 in the light source device. For example, as the prism sheet 8, a cross prism sheet that is obtained by combining a first prism sheet 8A and a second prism sheet 8B illustrated in FIG. 20 may be used. Alternatively, either one of the first prism sheet 8A and the second prism sheet 8B may be used. A plurality of prisms 51 each extending in a first direction Y1 are formed on a surface of the first prism sheet 8A. A plurality of second prisms 52 each extending in a second direction X1 that intersects the first direction Y1 are formed on a surface of the second prism sheet 8B.

(2.2 Function and Effects)

Figure 21:
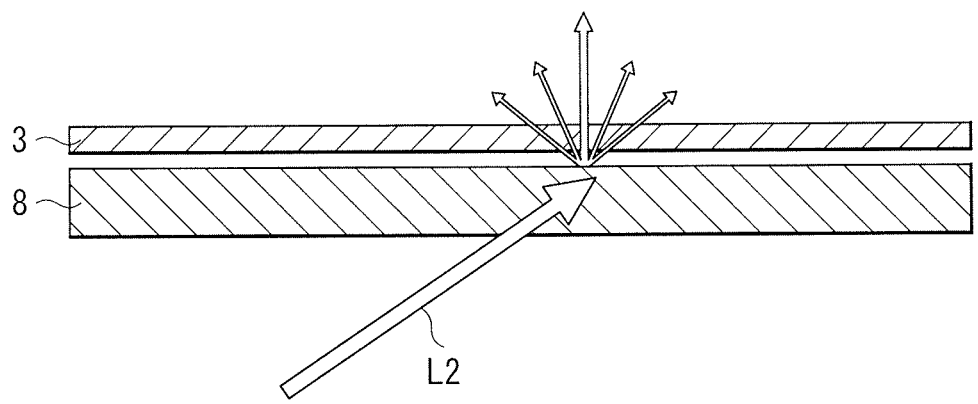
FIG. 21 is a sectional diagram illustrating a function of the prism sheet in the light source device according to the second embodiment.

FIG. 21 illustrates a function of the prism sheet 8. For example, as illustrated in FIG. 21, when the oblique component L2 enters the prism sheet 8, the prism sheet 8 allows an angle of the light to rise up in a vertical direction or a substantially vertical direction, and emits the light. Accordingly, occurrence of color unevenness at the time of performing local light emission control (local dimming) as described below is suppressed.

As described with use of FIG. 6, when all of the plurality of light sources 2 emit light, color unevenness is dissolved by making the arrangement distance D of the plurality of light sources 2 small or making the distance H between the plurality of light sources 2 and the wavelength conversion sheet 3 large to establish a state where the vertical component L1 and the oblique component L2 of the light from the light source 2 are uniformly mixed in the wavelength conversion sheet 3. Moreover, as described in the above-described first embodiment, the diffusion member 4 is disposed below the wavelength conversion sheet 3, which makes it possible to dissolve color unevenness.

On the other hand, when the local dimming is performed, non-lighting part and finely-lighting part are generated in the plurality of light sources 2, and thus difference in light emission distribution of the plurality of light sources 2 is generated. In this case, intensity difference is generated for each optical path of light (for example, blue light) that enters the wavelength conversion sheet 3 from the respective light sources 2, and color unevenness in which the non-lighting part and the finely-lighting part turn yellow as compared with normal lighting part occurs. Moreover, in a state where the local dimming is performed, from above the light source 2 that emits light at normal intensity, light returning from the wavelength conversion sheet 3 and the optical sheet 5 to the back side (the substrate 1 side) is reflected while being diffused by the reflective sheet 6, is then spread to the front side of the non-lighting part and the finely-lighting part, and then returns to the wavelength conversion sheet 3 side again. The returned light passes through the wavelength conversion sheet 3 again, and for example, may be converted into green light or red light with use of part of blue light (while decreasing the blue light). Therefore, the light after passing through the wavelength conversion sheet 3 that is generated by returned light becomes yellowish, which enhances yellow coloring of the non-lighting part and the finely-lighting part. As a result, when it is applied to the display unit, an image at the finely-lighting luminance display part by the local dimming becomes yellowish to impair dignity. Note that, when it is used as a backlight of a liquid crystal display unit, color change to yellow by a planar light source is not observed because a pixel opening by liquid crystal is closed at a black display part. According to the second embodiment, it is possible to suppress occurrence of color unevenness at the time of the above-described local dimming, by a function of the prism sheet 8.

3. Third Embodiment (3.1 Structure and Function)

Figure 22:
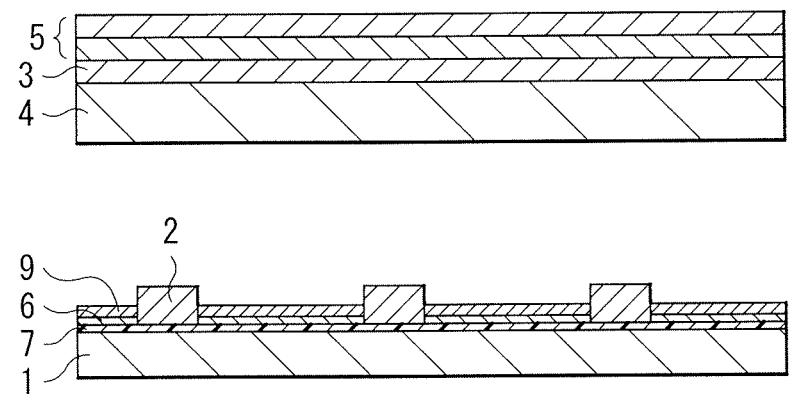
FIG. 22 is a sectional diagram illustrating a structure example of a light source device according to a third embodiment.

FIG. 22 illustrates a structure example of a light source device according to a third embodiment. The light source device according to the third embodiment has a structure substantially similar to that in FIG. 1 except that a cut filter 9 is additionally disposed on the light source substrate 1. The cut filter 9 is disposed so as to cover the surface of the reflective sheet 6. The cut filter 9 is an optical filter that allows the light (for example, blue light) emitted from the light source 2 to pass therethrough and cuts light (for example, red light and green light, or yellow light) that is wavelength-converted by the wavelength conversion sheet 3. The cut filter is not necessarily a filter completely cutting light that is wavelength-converted by the wavelength conversion sheet 3, and it is only necessary for the cut filter 9 to have characteristics in which transmittance to the light wavelength-converted by the wavelength conversion sheet 3 is lower than the transmittance to the light emitted from the light source 2.

Figure 23:
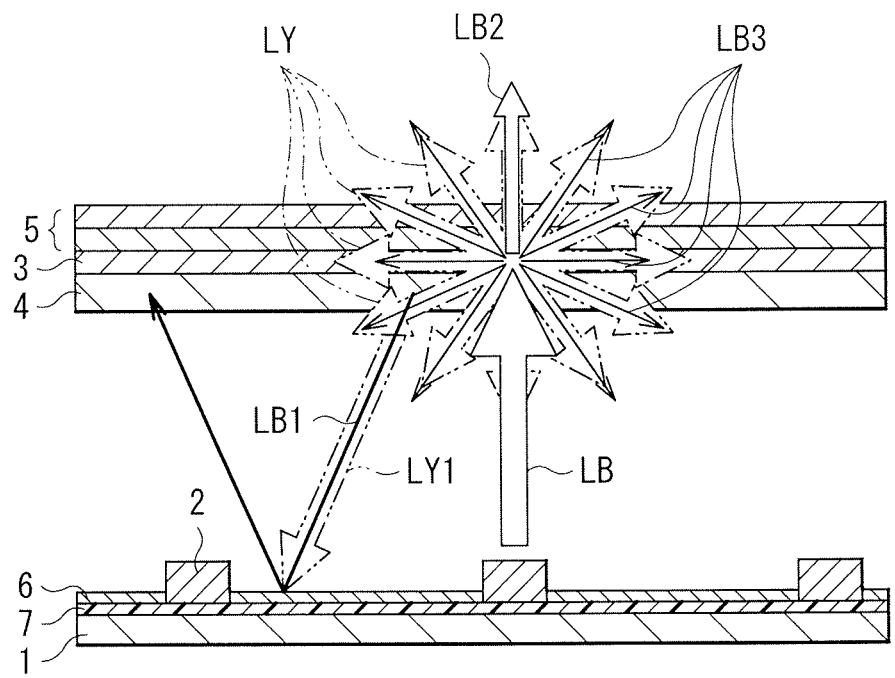
FIG. 23 is a sectional diagram illustrating a function of a cut filter in the light source device according to the third embodiment.

FIG. 23 illustrates a function of the cut filter 9. In the case of the structure of FIG. 5, the downward light LB1 returning to the light source substrate 1 side, out of the light LB emitted from the light source 2, is reflected by the reflective sheet 6, and directs toward the wavelength conversion sheet 3 again. Likewise, the downward light LY1 out of the wavelength-converted light LY is also reflected by the reflective sheet 6 and directs toward the wavelength conversion sheet 3 again. On the other hand, in the structure of the third embodiment, as illustrated in FIG. 23, reflection of the wavelength-converted downward light LY1 is suppressed by provision of the cut filter 9. The downward light LB1 not wavelength-converted passes through the cut filter 9 to be reflected by the reflective sheet 6, and then directs toward the wavelength conversion sheet 3 again.

As described in the above-described second embodiment, when the local dimming is performed, the non-lighting part and the finely-lighting part are generated in the plurality of light sources 2, which causes color unevenness in which the non-lighting part and the finely-lighting part become, for example, yellowish as compared with the normal lighting part. According to the third embodiment, providing the cut filter 9 makes it possible to suppress reflection of the wavelength-converted downward light LY1 (for example, yellow light), and thus yellow light reused as recycle light is decreased. Accordingly, occurrence of color unevenness to yellowish is suppressed.

(3.2 Modification of Third Embodiment)

Figure 24:
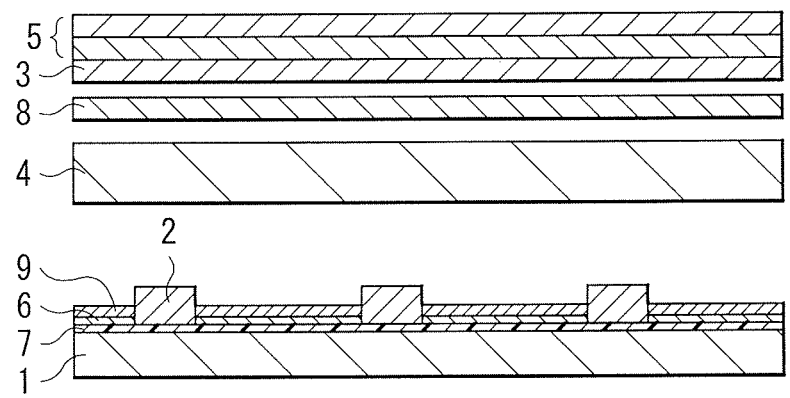
FIG. 24 is a sectional diagram illustrating a first structure example of a light source device according to a modification of the third embodiment.
Figure 25:
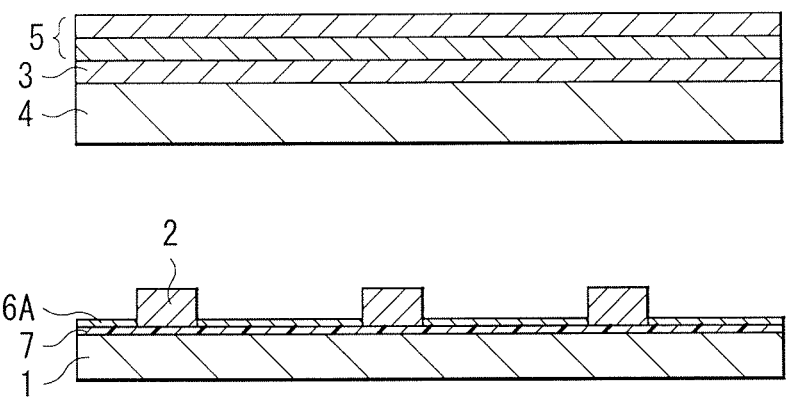
FIG. 25 is a sectional diagram illustrating a second structure example of the light source device according to a modification of the third embodiment.

FIG. 24 and FIG. 25 each illustrate a structure example of a light source device according to a modification of the third embodiment. As illustrated in FIG. 24, a structure combined with the structure of the above-described second embodiment (FIG. 19) may be employed. In other words, a structure including the prism sheet 8 and the cut filter 9 may be employed. In addition, as illustrated in FIG. 25, for example, a reflective sheet 6A with filter function, which is obtained by providing the function of the cut filter 9 to the reflective sheet 6 through coloring, may be disposed. The reflective sheet 6A with the filter function is not necessarily a reflective sheet that completely cuts the light wavelength-converted by the wavelength conversion sheet 3, and it is only necessary for the reflective sheet 6A to have filter characteristics allowing reflectance to the light wavelength-converted by the wavelength conversion sheet 3 to be lower than the reflectance to the light emitted from the light source 2. For example, the reflective sheet 6A may have filter characteristics that allow reflectance of green light and red light that are wavelength converted, to be lower by about 21% or more than the reflectance of the blue light emitted from the light source 2. For example, when the reflectance of the blue light is about 95%, the reflectance of green light and red light may be preferably about 75% or less. In this case, the reflectance of green light and red light is lower by 1−(75/95)=21% or more than the reflectance of the blue light.

4. Numerical Examples

Effects of luminance improvement by dissolving the granular unevenness in the first modification of the first embodiment described above (in the structure example in which the diffuser with the shaped surface 40 is disposed as the diffusion member 4) were specifically simulated. Simulation results are illustrated in Table 2 and Table 3.

Table 2 and Table 3 illustrate results obtained by methods of dissolving granular unevenness that are roughly divided into following three methods.

Method 1: a structure in which the post-attached lens 24 (see FIG. 16) is provided in the light source 2 (with the normal diffusion member 4)

Method 2: a structure in which the diffuser with the shaped surface 40 is disposed (without the post-attached lens 24)

Method 3: a structure in which only the normal diffusion member 4 is disposed (a method in which the granular unevenness is eliminated by increasing the number of LEDs as the light sources 2A without providing the post-attached lens 24)

As a structure common to the respective methods, cross-arranged two prism sheets and the DBEF were disposed as the optical sheet 5, in addition to the normal diffusion member 4 or the diffuser with the shaped surface 40. Moreover, an optical distance between the light sources 2 or 2A and the wavelength conversion sheet 3 was set to 16 mm. The entire size of the light source device was 55 inches.

The calculation was made assuming that the number of LEDs as the light sources 2 or 2A necessary for dissolving the granular unevenness was as follows:
Method 1: 680 pieces
Method 2: 832 pieces
Method 3: 1360 pieces Moreover, in the respective methods described above, the calculation was made assuming that the package size (PKG size) of the LED as the light source 2 was as follows. Note that, in the method 1, the direct potting type structure is not provided.
Normal size: 3.2 mm×2.85 mm
Small size 1: 4 mm×2 mm
Small size 2: 3 mm×1.4 mm
Direct potting type (Dir P): φ3 mm
The following values were used as the other conditions.

Transmittance of post-attached lens 24 (acryl): 93%
Reflectance of reflective sheet 6: 98%
Reflectance of resist layer 7: 70%
Reflectance of LED package (normal and small size): 88%
Reflectance of direct potting type LED package: 81%
Reflectance of LED package below post-attached lens 24: 79.4%
Reflectance of resist layer 7 below post-attached lens 24: 86.4%

Incidentally, as described above, in the reflective sheet 6, the through holes 61 to dispose the light sources 2 or 2A are formed. Therefore, in the region of the through holes 61, exposed surfaces of the resist layer 7 are provided around the light sources 2 or 2A. In Table 2, results obtained by calculating respective area ratios occupied by LED package, the exposed surfaces of the resist layer 7, the reflective sheet 6, and the like, on the outermost surface of the light source substrate 1 are illustrated for each method.

In Table 3, reflectance of the entire region of the outermost surface on the light source substrate 1 as a whole is illustrated as a total (TTL) reflectance. In addition, as described above, light recycle is performed between the light source substrate 1 and both of the wavelength conversion sheet 3 and the optical sheet 5 by reflection on the light source substrate 1. The inventor of the present application confirmed from experiment that luminance as the light source device is obtained by performing recycle four times. In other words, since reflection is performed four times on the light source substrate 1, fourth power of the TTL reflectance is calculated. The value of the fourth power of the TTL reflectance corresponds to final luminance. In Table 3, to compare difference in final luminance, results obtained by comparing and calculating the fourth power of the TTL reflectance for each method and for each size of the LED package are illustrated.

It is found from the simulation results that using the diffuser with the shaped surface 40 is advantageous in luminance improvement irrespective of the size and form of the LED package. Moreover, in the respective methods, it is found that when the distance of opposing corners of the LED package or the size φ of the direct potting type light source is equal to or smaller than 77% of the size of the normal LED package, the area ratio occupied by the reflective sheet 6 is increased, and the luminance is accordingly improved. In this example, the size of the opposing corners of the normal LED package is 4.3 mm, the size of the opposing corners of the LED package of the above-described small size 2 is 3.3 mm, and the ratio thereof is 0.77.

TABLE 2

| Method of dissolving granular unevenness | PKG size | Area ratio and premise reflectance | | | | |
|---|---|---|---|---|---|---|
| | | PKG surface below lens Reflectance 79.4% | Resist surface below lens Reflectance 86.4% | Exposed surface of resist layer Reflectance 70% | PKG surface out of lens Reflectance PKG: 90% Dir P: 80% | Surface of reflective sheet Reflectance 98% |
| Post-attached lens | Normal | 0.74% | 14.50% | 6.47% | — | 78.29% |
| | Small size 1 | 0.65% | 15.95% | 6.73% | — | 76.67% |
| | Small size 2 | 0.34% | 8.76% | 6.73% | — | 84.17% |
| Diffuser with shaped surface | Normal | — | — | 4.32% | 0.90% | 94.78% |
| | Small size 1 | — | — | 3.54% | 0.79% | 95.67% |
| | Small size 2 | — | — | 2.68% | 0.42% | 96.91% |
| | Dir P | — | — | 2.10% | 0.70% | 97.21% |

TABLE 2-continued

Area ratio and premise reflectance

| Method of dissolving granular unevenness | PKG size | PKG surface below lens Reflectance 79.4% | Resist surface below lens Reflectance 86.4% | Exposed surface of resist layer Reflectance 70% | PKG surface out of lens Reflectance PKG: 90% Dir P: 80% | Surface of reflective sheet Reflectance 98% |
|---|---|---|---|---|---|---|
| Only normal diffuser | Normal | — | — | 7.06% | 1.47% | 91.47% |
| | Small size 1 | — | — | 5.79% | 1.29% | 92.92% |
| | Small size 2 | — | — | 4.37% | 0.68% | 94.95% |
| | Dir P | — | — | 3.43% | 1.14% | 95.43% |

TABLE 3

| Method of dissolving granular unevenness | PKG size | TTL Reflectance | Fourth-power of TTL Reflectance | Fourth-power reflectance ratio | |
|---|---|---|---|---|---|
| Post-attached lens | Normal | 91.3% | 69.5% | Ref | |
| | Small size 1 | 90.8% | 67.9% | 0.98 | |
| | Small size 2 | 93.2% | 75.4% | 1.09 | |
| Diffuser with shaped surface | Normal | 96.7% | 87.4% | 1.26 | Ref |
| | Small size 1 | 96.7% | 87.5% | 1.26 | 1.00 |
| | Small size 2 | 97.2% | 89.3% | 1.29 | 1.02 |
| | Dir P | 97.3% | 89.6% | 1.29 | 1.02 |
| Only normal diffuser | Normal | 95.9% | 84.5% | 1.22 | Ref |
| | Small size 1 | 96.3% | 85.8% | 1.24 | 1.02 |
| | Small size 2 | 96.7% | 87.5% | 1.26 | 1.04 |
| | Dir P | 96.8% | 88.0% | 1.27 | 1.04 |

5. Other Embodiments

The technology of the present disclosure is not limited to those described in the respective embodiments, and is variously modified.

Figure 26:
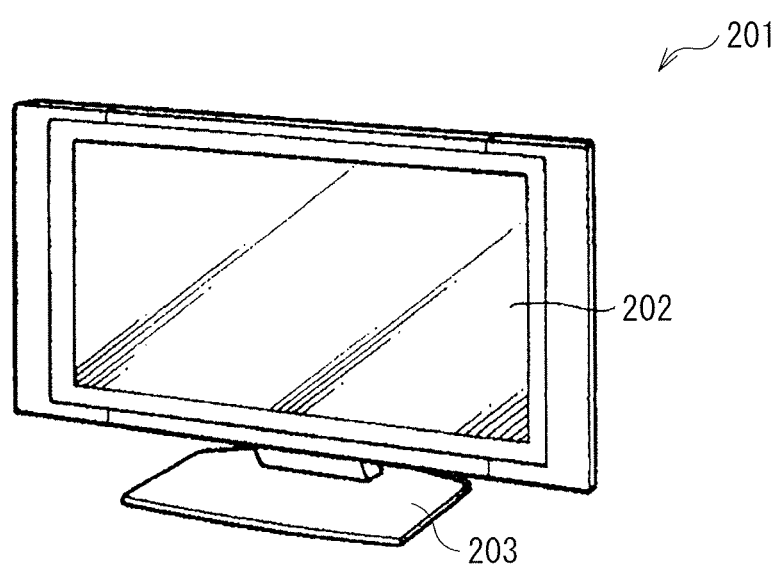
FIG. 26 is an appearance diagram illustrating an example of a display unit.

For example, the light source device according to any of the above-described embodiments may be applied as a backlight of a display unit 201 as illustrated in FIG. 26. The display unit 201 includes a display section 202 and a stand 203. The display section 202 may include, for example, a transmission type liquid crystal display panel, and displays an image based on illumination light from a backlight that is disposed on a back surface side of the display section 202. The light source device according to any of the above-described respective embodiments may be applied as such a back light.

For example, the present technology may be configured as follows:

(1) A light source device including:
a substrate;
a plurality of light sources disposed on the substrate;
a wavelength conversion member disposed to face the plurality of light sources; and
a diffusion member disposed between the wavelength conversion member and the plurality of light sources, and configured to uniformize distribution of traveling direction angle of incident light.

(2) The light source device according to (1), wherein the diffusion member is a diffuser with a shaped surface.

(3) The light source device according to (2), wherein the diffuser with the shaped surface has optical elements two-dimensionally arranged on a surface, each of the optical elements having a predetermined shape.

(4) The light source device according to any one of (1) to (3), wherein each of the light sources has a light emitting element chip and a sealant that seals the light emitting element chip on the substrate.

(5) The light source device according to (4), wherein a dome lens is formed of the sealant and a following condition is satisfied, $$0.65 \leq h/r \leq 1$$

where h is a height of the dome lens and r is a radius of the dome lens.

(6) The light source device according to any one of (1) to (5), further including
a first prism sheet disposed between the wavelength conversion member and the diffusion member and having a plurality of first prisms on a surface, each of the plurality of first prisms extending in a first direction.

(7) The light source device according to (6), further including
a second prism sheet disposed between the wavelength conversion member and the diffusion member, and having a plurality of second prisms on a surface, each of the plurality of second prisms extending in a second direction orthogonal to the first direction.

(8) The light source device according to any one of (1) to (7), further including:
a reflective member disposed in a region on the substrate, the region being different from a region provided with the plurality of light sources; and
a cut filter disposed to cover the reflective member and having filter characteristics, the filter characteristics allowing a transmittance to light that is wavelength-converted by the wavelength conversion member, to be lower than a transmittance to light emitted from each of the light sources.

(9) The light source device according to any one of (1) to (7), further including
a reflective member disposed in a region on the substrate, the region being different from a region provided with the plurality of light sources, wherein
the reflective member has filter characteristics allowing a reflectance to light that is wavelength-converted by the wavelength conversion member, to be lower than a reflectance to light emitted from each of the light sources.

(10) The light source device according to any one of (1) to (9), wherein the plurality of light sources are two-dimensionally arranged on the substrate.

(11) The light source device according to (10), wherein the plurality of light sources are placed under individual light emission control for every one light source or every two or more light sources.

(12) The light source device according to any one of (1) to (11), wherein each of the plurality of light sources includes a light emitting element configured of an LED.

(13) The light source device according to any one of (1) to (12), wherein
the light sources each configured to emit blue light, and
the wavelength conversion member converts part of blue light emitted from the light sources into red light and green light.

(14) The light source device according to any one of (1) to (12), wherein
the light sources each configured to emit blue light, and
the wavelength conversion member converts part of blue light emitted from the light sources into yellow light.

(15) A display unit provided with a light source device configured to emit illumination light and a display section configured to display an image based on the illumination light from the light source device, the light source device including:
a substrate;
a plurality of light sources disposed on the substrate;
a wavelength conversion member disposed to face the plurality of light sources; and
a diffusion member disposed between the wavelength conversion member and the plurality of light sources, and configured to uniformize distribution of traveling direction angle of incident light.

It should be understood by those skilled in the art that various modifications, combinations, sub-combinations, and alterations may occur depending on design requirements and other factors insofar as they are within the scope of the appended claims or the equivalents thereof.

What is claimed is:
1. A light source device, comprising:
a substrate;
an in-plane region that comprises:
a plurality of first regions that comprises a plurality of light sources, wherein each light source of the plurality of light sources comprises a light emitting element chip; and
a second region that comprises a reflective member, wherein
the second region is different from the plurality of first regions,
a reflective surface of the reflective member is parallel to a surface of the substrate,
the reflective member includes a plurality of through holes,
each light source of the plurality of light sources is in one of the plurality of through holes, and
each light source of the plurality of light sources is separated from the reflective member within the plurality of through holes;
a wavelength conversion member that faces the plurality of light sources, wherein the wavelength conversion member comprises a plurality of quantum dots;
a diffusion member between the wavelength conversion member and the plurality of light sources, wherein
the wavelength conversion member is on a light emission surface side of the diffusion member, and
the diffusion member is configured to uniformly distribute incident light at a travel direction angle; and
a cut filter on the reflective member, wherein the cut filter is configured to suppress reflection of first light received from the wavelength conversion member,
wherein the reflective member is configured to direct second light different from the first light toward the wavelength conversion member based on the suppression.

2. The light source device according to claim 1, wherein the diffusion member is a diffuser that has a shaped surface.

3. The light source device according to claim 2, wherein the diffuser comprises a plurality of optical elements arranged two-dimensionally.

4. The light source device according to claim 1, wherein each light source of the plurality of light sources further comprises a sealant configured to seal the light emitting element chip on the substrate.

5. The light source device according to claim 4, wherein the sealant has a shape of a dome lens, and
the sealant satisfies following condition:

$$0.65 \leq h/r \leq 1$$

where h is a height of the dome lens and r is a radius of the dome lens.

6. The light source device according to claim 1, further comprising:
a first prism sheet between the wavelength conversion member and the diffusion member, wherein
the first prism sheet comprises a plurality of first prisms on a first surface of the first prism sheet, and
each first prism of the plurality of first prisms extends in a first direction.

7. The light source device according to claim 6, further comprising:
a second prism sheet between the wavelength conversion member and the diffusion member, wherein
the second prism sheet comprises a plurality of second prisms on a second surface of the second prism sheet,
each second prism of the plurality of second prisms extends in a second direction, and
the second direction is orthogonal to the first direction.

8. The light source device according to claim 1, wherein the cut filter has a plurality of filter characteristics that allows a first transmittance to the first light, that is wavelength-converted by the wavelength conversion member, to be lower than a second transmittance to the incident light emitted from each light source of the plurality of light sources, and
the incident light is different from the first light.

9. The light source device according to claim 1, wherein the reflective member has a plurality of filter characteristics that allows a first reflectance to the first light, that is wavelength-converted by the wavelength conversion member, to be lower than a second reflectance to the incident light emitted from each light source of the plurality of light sources, and
the incident light is different from the first light.

10. The light source device according to claim 1, wherein the plurality of light sources is two-dimensionally arranged on the substrate.

11. The light source device according to claim 10, wherein the substrate further comprises a wiring pattern configured to individually control light emission for each light source of the plurality of light sources.

12. The light source device according to claim 1, wherein each light source of the plurality of light sources includes at least one light emitting device (LED).

13. The light source device according to claim 1, wherein each light source of the plurality of light sources is configured to emit blue light, and
the wavelength conversion member is configured to convert a part of the emitted blue light into red light and green light.

14. The light source device according to claim 1, wherein each light source of the plurality of light sources is configured to emit blue light, and
the wavelength conversion member is configured to convert a part of the emitted blue light into yellow light.

15. The light source device according to claim 1, wherein each quantum dot of the plurality of quantum dots has a diameter greater than or equal to 1 nm and less than or equal to 100 nm.

16. The light source device according to claim 1, further comprising a resist layer between the substrate and the reflective member, wherein a portion of the resist layer within each through hole of the plurality of through holes is exposed to the diffusion member based on the separation between each light source of the plurality of light sources and the reflective member.

17. The light source device according to claim 1, further comprising an optical sheet on a light emission surface side of the wavelength conversion member, wherein the optical sheet is different from the wavelength conversion member.

18. The light source device according to claim 3, wherein the diffuser comprises, as the plurality of optical elements, one of square pyramid-shaped convex patterns or triangular pyramid-shaped convex patterns.

19. A display unit, comprising:
a light source device configured to emit illumination light; and
a display section configured to display an image based on the emitted illumination light from the light source device,
wherein the light source device comprises:
a substrate;
an in-plane region that comprises:
a plurality of first regions that comprises a plurality of light sources, wherein each light source of the plurality of light sources comprises a light emitting element chip; and
a second region that comprises a reflective member, wherein
the second region is different from the plurality of first regions,
a reflective surface of the reflective member is parallel to a surface of the substrate,
the reflective member includes a plurality of through holes,
each light source of the plurality of light sources is in one of the plurality of through holes, and
each light source of the plurality of light sources is separated from the reflective member within the plurality of through holes;
a wavelength conversion member that faces the plurality of light sources, wherein the wavelength conversion member comprises one of a plurality of quantum dots or a fluorescent material;
a diffusion member between the wavelength conversion member and the plurality of light sources, wherein
the wavelength conversion member is on a light emission surface side of the diffusion member, and
the diffusion member is configured to uniformly distribute incident light at a travel direction angle; and
a cut filter on the reflective member, wherein the cut filter is configured to suppress reflection of first light received from the wavelength conversion member,
wherein the reflective member is configured to direct second light different from the first light toward the wavelength conversion member based on the suppression.

* * * * *